United States Patent [19]

Ericsson

[11] Patent Number: 4,516,495
[45] Date of Patent: May 14, 1985

[54] METHOD AND ARRANGEMENT FOR POSITIONING A SECOND PATTERN ORIGINATING FROM A PATTERN FORMED ON A STENCIL IN RELATION TO A MATERIAL INTENDED FOR THE PATTERN

[75] Inventor: Sylve J. D. Ericsson, Tumba, Sweden

[73] Assignee: Svecia Silkscreen Maskiner AB, Norsborg, Sweden

[21] Appl. No.: 611,629

[22] Filed: May 18, 1984

[30] Foreign Application Priority Data

| May 18, 1983 [SE] | Sweden | 8302802 |
| Mar. 20, 1984 [SE] | Sweden | 8401527 |

[51] Int. Cl.³ .............. B41F 1/34; B41F 15/36; B41L 13/02
[52] U.S. Cl. ................ 101/129; 101/127.1; 101/DIG. 12; 33/184.5; 355/40
[58] Field of Search ........... 101/129, 127.1, 128, 101/126, 114, 115, DIG. 12; 33/184.5; 355/40

[56] References Cited

U.S. PATENT DOCUMENTS

| 2,984,910 | 5/1961 | LaCour | 33/184.5 |
| 3,151,400 | 10/1964 | Schmitt | 101/DIG. 12 |
| 3,566,788 | 3/1971 | Haws | 101/DIG. 12 |
| 3,926,112 | 12/1975 | Neman | 101/127.1 |
| 3,943,851 | 3/1976 | Iwada | 101/127.1 |
| 4,226,181 | 10/1980 | Ericsson | 101/129 |
| 4,404,903 | 9/1983 | Cronin | 101/129 |
| 4,463,673 | 8/1984 | Moore | 101/129 |
| 4,469,022 | 9/1984 | Meador | 101/129 |

Primary Examiner—E. H. Eickholt
Attorney, Agent, or Firm—Burns, Doane, Swecker & Mathis

[57] ABSTRACT

Method and arrangement for positioning a second pattern (10a) originating from a first pattern formed on a stencil in relation to a material (8) intended for the pattern. Said second pattern (10a) is formed by causing a coating intended for the material to pass through the first pattern, for example by means of a scraper blade in a silk screen printing machine. The position of the second pattern (10a) relative to a reference point, usually the frame components of the printing machine, is stored in an organ. Once a sheet of material to which the second pattern (10a) is to be transferred has been moved into the printing position, the position of the material or of a pattern which has already been applied to it is evaluated together with any discrepancy which would arise if the second pattern (10a) were to be applied to that material in that position. A frame holding the stencil and/or a printing table and/or the material is displaced or is caused to move in some other way into a position dependent on the size and direction of the discrepancy such that, when the second pattern (10a) is applied to the material, said pattern will adopt a position on the material in which any previously identified discrepancy has been compensated for fully or to a satisfactory extent.

25 Claims, 6 Drawing Figures

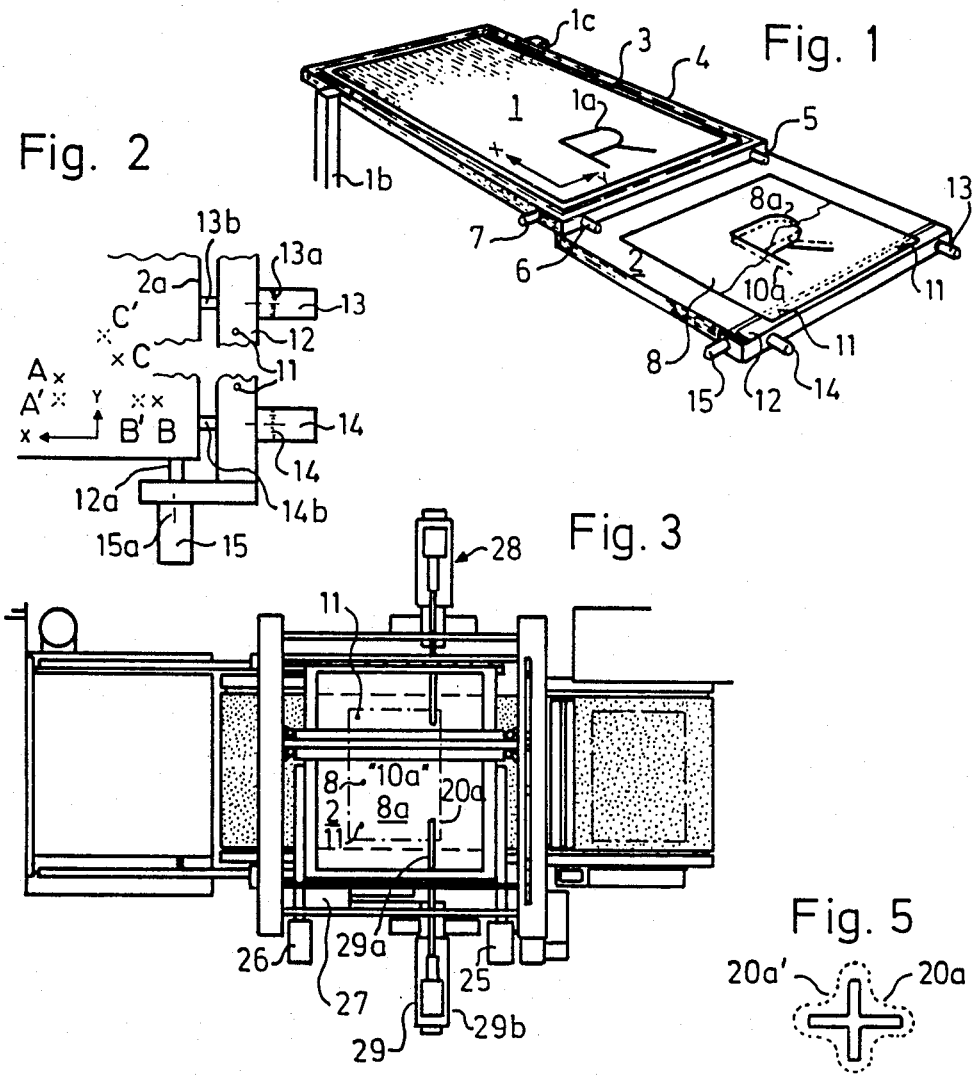
Fig. 1
Fig. 2
Fig. 3
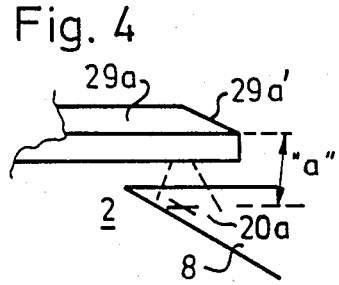
Fig. 4
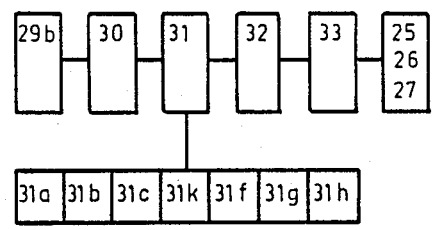
Fig. 5
Fig. 6

METHOD AND ARRANGEMENT FOR POSITIONING A SECOND PATTERN ORIGINATING FROM A PATTERN FORMED ON A STENCIL IN RELATION TO A MATERIAL INTENDED FOR THE PATTERN

TECHNICAL FIELD

The present invention relates to a method enabling a second pattern originating from a first pattern formed on a stencil to be positioned in relation to a material intended for the pattern. The method in accordance with the invention is based on the second pattern being formed by causing a coating intended for the material to pass through the first pattern by means of a scraper blade in a silk screen printing machine, on the fact that in this way a discrepancy can arise between the first and the second patterns. Since the second pattern is the pattern which will be printed on the material, it is essential that this pattern should agree with a desired printed pattern and should be situated in a desired position on the material.

The present invention likewise includes an arrangement enabling the positioning in a silk screen printing machine of a second pattern originating from a first pattern formed on a stencil in relation to a material intended for the pattern, and with the second pattern being formed in this case by causing a coating intended for the material to pass through the first pattern by means of a scraper blade capable of moving along the stencil.

DESCRIPTION OF THE PRIOR ART

A number of different embodiments have already been disclosed of methods and arrangements for positioning a second pattern originating from a first pattern formed on a stencil in relation to a material intended for the pattern.

Reference may thus be made to the fact that previously disclosed in U.S. Pat. No. 4,226,181 is a method and an apparatus for adjusting the position of a stencil in relation to a printing table, being characterized by:

(a) the application of a transparent material to the printing table over a reference pattern;

(b) the transfer of the stencil pattern to the transparent material by means of a printing process;

(c) the compensation for and the elimination of every discrepancy between the printed pattern and the reference pattern by causing the transparent material bearing the printed pattern to be displaced in such a way that the pattern agrees with the reference pattern; and (d) the adjustment of the position of the stencil and of a frame supporting said stencil in the same way as the adjustment of the transparent material is effected.

Also worthy of mention here is the previous disclosure in Swedish patent application No. 79 03516-8 of a method of adjusting a printed pattern on a material in relation to a reference pattern, said method exhibiting the following special characteristics:

(a) a reference pattern serving as an original is applied to a register table exhibiting register organs for the material, said organs preferably corresponding to register organs in a printing machine;

(b) one or more sensor organs are set in relation to parts of the reference pattern (preferably register marks) formed on the original;

(c) the sensor organ evaluates the positional values of the parts;

(d) the original is then best removed;

(e) a printed pattern is applied to a sheet of material once it has been registered by the register organs in the printing machine;

(f) this sheet of material, printed in accordance with 'e' is applied to the register organs of the register table;

(g) the parts formed on this sheet of material, printed in accordance with 'e', are evaluated by the sensor organ;

(h) any discrepancy from the absolute value and direction between the print in accordance with 'c' and the print in accordance with 'e' is evaluated; and (i) from the discrepancy thus identified are evaluated the displacement values necessary in order to compensate for the discrepancy and to ensure that the printed image is applied exactly or essentially exactly to the material.

The prior art also includes the matter illustrated and described in German patent specification No. 30 27 717, namely a process for the control of a printing arrangement with organs capable of being controlled individually.

DESCRIPTION OF THE PRESENT INVENTION

TECHNICAL PROBLEM

Against the background of what has already been disclosed within the technical field in question, an extremely acute problem is associated not only with the ability to determine in a simple fashion any discrepancy between the position of a sheet of material and/or the position of a pattern printed on a sheet of material and a position for an expected printed pattern (the second pattern), but also with the ability to perform by simple means a compensatory operation with the result that the expected print and/or any subsequent print will be applied exactly to the reference positions or will, at any rate, be applied within an extremely narrow range of tolerances, let us say to an accuracy of less than 0.1 mm.

In view of the major demands which are currently being placed on the need for high utilization of printing machines, any measure which is able to reduce the down-time and the running-in period will be particularly important.

Reference may thus also be made to the fact that the setting-up operation for the two previously disclosed possibilities indicated above has been found to be complicated principally because setting-up cannot be done simply by means of two adjustment organs, and because in this case a complicated interaction between three adjustment organs is called for. It is also necessary in the case of one of the embodiments to make a visual decision when each point for the new printed pattern on the transparent material is situated exactly above the corresponding points on the reference pattern. Different degrees of stretch in the stencils during the printing phase contribute to the difficulties encountered in achieving exact alignment.

The achievement of exact alignment between the position of the printed pattern for each point and predetermined position for each point is practically impossible in silk screen printing machines because the stencil is subject to stretching during the printing phase.

Practical experience has shown that a previously disclosed possibility of moving the stencil during the printing phase in order to compensate for any stretch in the stencil is certainly capable of making a significant contribution to the improvement of the positional accuracy, but is unable fully to compensate for the stretching, which is less at the start of the printing process than at the end of the printing process.

For the purposes of practical application it is necessary, therefore, to position the second pattern on the material or above an existing pattern on the material in such a way that the printed second pattern will exhibit the minimum possible average deviation from a predetermined position. This calls for the use of a complicated process to minimize any discrepancy, which may be judged to be different for different parts of the print.

The problems encountered when making this evaluation and adjustment are associated principally with the inconvenience that previously disclosed arrangements required adjustments to be made and proofs to be taken in order to be able to evaluate the discrepancy.

A major technical problem is thus associated with the creation of conditions such that the form and position of the anticipated second pattern, before it is applied as print to a sheet of material, may be determined whilst the material is assuming its position on the printing table and without printing actually having occurred, and such that any necessary compensation can be made before printing by causing the stencil frame and/or the printing table and/or the material to move in a previously disclosed fashion into a position in which the discrepancy as a whole can be minimized.

SOLUTION

The present invention thus proposes a method of positioning a second pattern originating from a first pattern formed on a stencil in relation to a material intended for the pattern. The second pattern is formed by causing a coating intended for the material to pass through the first pattern by means of a scraper blade in a silk screen printing machine.

The position of the second pattern in relation to a reference point, usually the frame components of the printing machine, is situated on one organ. Once a sheet of material to which the second pattern is to be transferred has been moved into the printing position, the position of the material is evaluated and with it also the discrepancy which would arise if the second pattern were to be applied to the sheets of material in that position, whereupon a frame holding the stencil and/or a printing table and/or the material is displaced or is caused to move in some other way into a position dependent on the size and direction of the discrepancy such that, when the second pattern is applied to the material, said pattern will adopt a position on the material in which any previously determined discrepancy is compensated for fully or to a satisfactory degree.

The invention also proposes that any discrepancy between the position of the second pattern and the desired position be evaluated at a number of reference positions, and that the size and direction of the respective discrepancy and, if appropriate, the location of its reference position constitute calculation quantities for the evaluation of the size and the direction applicable to the smallest possible total discrepancy.

The invention proposes in particular that:

(a) the position of the second pattern is determined in relation to the frame of the silk screen printing machine;

(b) the position of the material and/or of its pattern is determined in relation to the position of the second pattern and the frame of the silk screen printing machine when the material adopts a position intended for printing;

(c) in the event of a discrepancy being identified between 'a' and 'b', measures are taken in order to displace the position of the second pattern towards a desired position exhibiting a small discrepancy; and (d) the second pattern is transferred to the material.

The present invention also includes an arrangement for positioning in a silk screen printing machine a second pattern originating from a first pattern formed on a stencil in relation to a material intended for the pattern by so arranging an organ as to adjust the position of the second pattern in relation to a reference point, as a rule a frame component of the printing machine. A sheet of material to which the second pattern is to be transferred is capable of being moved into a printing position, and when in that position the position of the material is evaluated, in addition to which means are provided which are so arranged as to evaluate any discrepancy which is likely to occur if the second pattern were to be applied to said material in said printing position. After any discrepancy has been evaluated, in the event of such discrepancy being present, a frame holding the stencil and/or a printing table and/or the material shall be displaced or caused to move in some other way into a position dependent on the size and direction of the discrepancy such that, when the second pattern is applied to the material, said pattern will adopt a position on the material in which any previously determined discrepancy is compensated for fully or to a satisfactory degree.

The invention also proposes that the position of the material shall be capable of being evaluated with the help of registration marks or a part of the previously applied pattern and that, in such a case, the position of the material and/or its pattern shall be evaluated with the help of one or more optical sensing organs, being preferably the evaluation of the position of the registration mark.

The invention also proposes that the position of each sheet of material be sensed, and that compensation for any actual discrepancy be made before the second pattern is transferred to the material.

It is also proposed that, once a sheet of material has been provided with a pattern after having arrived in the printing position, an organ shall obtain information in respect of the positional values for the actual position of the pattern, and that these values shall be transferred to a computer unit in which are stored data in respect of the values of a position of the second pattern if said pattern were to be applied to the material. The values obtained from the organ are compared with the computer unit with the values stored therein, with the computer unit being so arranged as to evaluate any discrepancy and, in the event of such discrepancy being identified, to apply to organs capable of interacting with the stencil frame and/or the printing table and/or the material an effect such that the discrepancy is compensated for fully or to a satisfactory degree.

The invention also proposes that the organ shall consist of a position-scanning unit capable of being introduced between the stencil and the material into a predetermined position.

In the event of one and the same silk screen printing machine exhibiting a number of printing tables and associated stencils and scraper blades, etc., and in which one and the same sheet of material is to be arranged as to move in stages from one printing table to an adjacent printing table in order to permit different patterns to be applied, it is proposed that a number of printing tables be equipped with organs intended to be capable of evaluating the position of the pattern which has been applied to the material at each of the preceding printing tables. The data obtained from the organ in respect of the values for the position of the actual pattern are transferred to the computer unit in which are stored data in respect of the values which are applicable to the pattern printed at this printing table and to the desired position. The values obtained are now compared in the computer unit, which is so arranged that, in the event of any discrepancy being identified, a displacement movement or similar will be applied to the stencil frame and/or to the printing table and/or to the material in order to compensate fully or to a satisfactory degree for the evaluated discrepancy.

It is also proposed that, during the period when printed material is being removed, position-scanning units be introduced between the stencil and the printing table so that, as a sheet of material assumes its position for printing on the printing table, the units will be able to sense the position of the material, whereupon the position-scanning units are withdrawn and during this period any discrepancy is evaluated in relation to the second pattern and measures are taken to compensate for said discrepancy, whereupon print may be applied to the material.

The invention also proposes that a registration mark which has been scanned or the main area of concentration of a part of the pattern shall be capable of being evaluated in order to form a significant value for the position concentrated into a single point. The scanning of the registration mark or the part of the pattern takes place in the form of optical scanning, when any analogue values arising from said scanning operation are capable of being converted into digital values and are, as such, suitable for input into the computer unit. The sensing component of the optical scanner is intended to be capable of moving forwards and backwards, and the position of the location to which movement takes place is input into the computer unit.

ADVANTAGES

The major advantages which can be associated with a method and an arrangement in accordance with the present invention are that the adjustment operation can now be shortened considerably at the same time as increased accuracy can be achieved between the position of the second pattern applied to the material and the material and/or the pattern already applied to it at an earlier stage. It is also possible in accordance with the present invention to minimize the effect of any discrepancy on the different parts of the pattern, even if other in themselves significant measures, such as the displacement of the stencil during the printing operation, are utilized with the intention of reducing the value of the discrepancy.

What may be regarded as the principal characteristic feature of a method of positioning a second pattern originating from a first pattern formed on a stencil in relation to a material intended for the pattern is indicated in the characterizing part of patent claim 1 below, whilst an arrangement for positioning in a silk screen printing machine a second pattern originating from a first pattern formed on a stencil in relation to a material intended for the pattern is indicated in the characterizing part of patent claim 9 below.

DESCRIPTION OF THE DRAWINGS

A preferred embodiment exhibiting the significant characteristic features of the present invention is described in greater detail below with reference to the accompanying drawing, in which:

FIG. 1 shows a perspective view in highly simplified form of a silk screen printing machine with the associated stencil and with the printing table shown in a position in which it is displaced from the stencil for the purpose of illustrating the possibilities for positioning a second pattern originating from a first pattern formed on a stencil in relation to the material intended for the pattern by causing the first pattern to be displaced and/or by causing the material to be displaced;

FIG. 2 shows a horizontal view of three adjustment organs attached to the printing table for the purpose of enabling the material to be displaced;

FIG. 3 shows a horizontal view of a silk screen printing machine in which the position-sensing organs which are significant for the invention are illustrated, and in which adjustment organs are provided for the purpose of positioning a second pattern originating from a first pattern formed on a stencil in relation to a material intended for the pattern by altering the position of the stencil in relation to the frame of the silk screen printing machine;

FIG. 4 shows a typical embodiment of a part of an arrangement for the evaluation of a registration mark on the material;

FIG. 5 illustrates the operating principle of the arrangement in accordance with FIG. 4 enabling a precise evaluation to be made of the position of the registration mark; and FIG. 6 shows in the form of a block diagram those components or organs which are capable of interacting with each other electrically in order to permit the positioning and the displacement of a second pattern originating from a first pattern formed on a stencil in relation to a material intended for the pattern.

DESCRIPTION OF THE PREFERRED EMBODIMENT

The present invention thus relates to a method and an arrangement enabling a second pattern 10a originating from a first pattern 1a formed on a stencil 1 to be positioned in relation to a material 8 intended for the pattern, with the second pattern being formed by causing a coating intended for the material 8 to pass through the first pattern 1a by means of a scraper blade or similar (not shown here) in a silk screen printing machine.

The basic principles of the present invention will now be described in greater detail with reference to FIG. 1.

The invention is based on the fact that the adjustment of the position of a stencil 1 in relation to the position of a printing table 2 or to the position of a sheet of material 8 placed on the printing table 2 is possible by adjusting the stencil, by adjusting the material and/or by adjusting the printing table. The typical embodiment in accordance with FIG. 1 illustrates various possibilities for performing a desired adjustment by changing the position of the stencil and/or by changing the position of the material. Changing the position of the printing table could also be effected in the same way as changing the position of the stencil.

For the purpose of permitting the adjustment of the position of the stencil in relation to the printing table and/or the position of the material, the stencil 1 is clamped in an inner first frame 3, which in turn is held by and positioned in an outer second frame 4. The inner frame 3 can be given various positions of displacement in relation to the outer frame 4, which in turn is held in a fixed relationship with the frame or frame components of the silk screen printing machine by means of three adjustment devices or adjustment organs to which the reference designations 5, 6 and 7 have been allocated.

By influencing the adjustment organs 5 and 6 simultaneously and in an identical fashion the inner frame 3 will be displaced in relation to the outer frame 4 along the 'x' direction of the co-ordinates, whilst an influence exerted only on the adjustment organ 7 will cause the inner frame 3 to be displaced along the 'y' direction of the co-ordinates in relation to the outer frame 4. The exertion of different influences on the adjustment organs 5 and 6 will cause the frame 3 to turn inside the outer frame 4, and this arrangement will permit compensation to be made for every minor deviation, no matter how it arises.

The outer frame 4 can, of course, be raised and lowered, but will remain in a fixed relationship with the frame of the printing machine, of which only the supports 1b and 1c are shown in FIG. 1.

The printing table 2 is shown as a printing table capable of fore-and-aft movement, although the movement and the position of the printing table are nevertheless related to the frame 1b, 1c of the printing machine.

To the printing table 2 is applied a sheet of material 8 with a previously applied pattern 8a. The pattern 8a illustrated here is identical with the pattern 1a exhibited by the stencil 1, namely the letter 'R'.

Since the material is held in a fixed relationship to the printing table 2, for example by means of a number of registration organs 11, the pattern 8a will also exhibit a fixed position in relation to the frame of the silk screen printing machine.

One of the objects of the present invention is to ensure that the first pattern in the form of the letter 'R', to which the reference designation 1a has been allocated, on the stencil 1 will, on being printed, produce a second pattern 10a, which must then lie in the most accurate position possible above the pattern 8a already printed on the material 8.

The assumption illustrated here is that the first pattern 1a of the stencil 1, when it is printed onto the material 8 as a second pattern 10a, is given a position which deviates from the position of the pattern 8a, and that it is accordingly necessary to displace the pattern on the stencil in the second frame 4 in such a way that, on printing, a second pattern 10a at a relative distance from the first pattern 1a will be positioned over the pattern 8a.

It should be noted here that a discrepancy will exist between the form of the first pattern 1a and the form of the second pattern 10a due to the stretching which occurs in the stencil during the printing operation. The principal object of the invention is to create conditions such that said second pattern 10a will be superimposed with the smallest possible discrepancies over the existing pattern 8a or will be applied with the same precision to the material.

The discrepancy illustrated in FIG. 1 between the second pattern 10a and the pattern 8a on the material illustrates that the stencil must be changed in such a way that the second pattern 10a is displaced in the 'y' direction of the co-ordinates and in the 'x' direction of the co-ordinates.

It is clear that this displacement may be achieved by causing the stencil 1 to be displaced in a desired manner in relation to the frame 4, although it is also possible by the same principle to cause the printing table 2 and/or the material to be displaced, with a number of adjustment organs 13, 14 and 15 being utilized in the latter case. This displacement takes place in an identical fashion to the displacement of the stencil 1 in the frame 4.

In FIG. 2 is shown in horizontal view the lateral surface of the printing table 2 with the adjustment organs 13, 14 and 15. It is clear that the adjustment organs 13, 14 interact with the lateral surface 2a of the table, where they interact with a bar 12 which supports the registration organ 11 for a sheet of material 8 (not shown here). It is proposed that the adjustment organs 13 and 14 should be pivotally mounted in the beam 12 and that a threaded component 13b and 14b should extend into the lateral surface 2a of the printing table, where it will interact with its own nut accommodated in a groove running parallel with the lateral surface 2a, said groove permitting the nuts to be displaced in the 'y' direction of the co-ordinates. By causing the adjustment organs 13 and 14 to be actuated to an identical degree and in the same direction, a displacement of the material 8 in the 'x' direction of the co-ordinates will be produced, whereas by turning and actuating the adjustment organ 15, which also interacts with the beam 12 in the manner outlined above, but in this case via an angled component 12a, a displacement will be produced in the 'y' direction of the co-ordinates. What this means is that, if the pattern 8a on the material 8 has a point located at 'A', whilst the second pattern 10a has a corresponding point located at 'A'', all that will be required is the actuation of the adjustment organ 15. If, on the other hand, the pattern 8a has a point located at 'B', what will be required is the identical actuation of both the adjustment organs 13 and 14 in order to cause a point 'B'' originating from the second pattern 10a to move to a position directly above 'B'. If, on the other hand, the pattern 8a has a point 'C' where the second pattern originating from the first pattern 10a on the stencil forms a point 'C'', what will be required is a displacement along the 'y' co-ordinate and a displacement along the 'x' co-ordinate, with this being achieved partly by being able to actuate the adjustment organ 13 and partly by being able to actuate the adjustment organ 14 and possibly also the adjustment organ 15.

Taking into consideration the possibility of adjustment illustrated with reference to FIGS. 1 and 2, a preferred embodiment of a silk screen printing machine constructed in accordance with the present invention is described below with reference to FIG. 3. The silk screen printing machine in accordance with FIG. 3 is greatly simplified in the interests of clarity, and only the possibility of adjusting the position of the stencil 1 in relation to the position of the material and/or that of its pattern is illustrated here.

FIG. 3 thus illustrates an arrangement enabling a second pattern 10a originating from a first pattern 1a formed on a stencil to be positioned in relation to a material 8 intended for the pattern and/or in relation to a pattern 8a previously applied to the material 8. This material rests upon a printing table 2, and the material 8 is registered in its position with the help of registration organs 11 and to a permissible accuracy of less than 1 mm. The print 10a which is to be applied to the material 8 may not, however, deviate by more than 0.1 mm from a pre-determined value, for which reason the ability to adjust and regulate the stencil is called for, so that the second pattern 10a originating from a first pattern 1a formed on the stencil, which is to be applied to the material 8, is actually applied within a narrow range of tolerances.

In order to permit the adjustment of the position of the stencil in relation to the material 8 are provided three stepping motors 25, 26 and 27 which operate basically in an identical fashion to the adjustment organs 5, 6 and 7 in FIG. 1, but with the exception that these motors are driven electrically by means of pulses.

The position of the material 8 and/or of its pattern 8a is evaluated with the help of one or more optical sensing organs, and the typical embodiment proposes the use of two such optical sensing organs to which the reference designations 28 and 29 have been allocated; as these organs are identical, only the organ 29 is illustrated in greater detail.

Reference may thus be made to the fact that the optical sensing organ 29 exhibits a lens system 29a connected to a camera 29b. The camera 29b and the lens system 29 are capable of being moved from the sensing position shown in FIG. 3 to a position outside the printing machine so as to permit, when in this extended position, the printing of the second pattern 10a onto the material 8.

With reference to FIG. 4 the free end 29a' of the lens system 29a is shown to exhibit a lens, said lens being so arranged as to be capable of discerning a registration mark 20a situated on the material 8. The registration mark 20a is shown in the form of a '+', although this registration mark could, of course, also be in the form of a hole or part of a pattern 8a already applied to the material.

Since the resolution of the lens system is dependent on the distance 'a' between the lens and the upper surface of the material 8, the registration mark 20a in the camera system will be capable of being perceived within the area shown by the dotted line 20a' in FIG. 5.

Irrespective of whether the camera system 29 and the camera 29b perceive the registration mark 20a precisely as it is or in the manner illustrated by the contour 20a', the position of the registration mark must be determined with great accuracy.

The analogue signal obtained from the camera 29b is so arranged as to be received by a camera controller 30, in which the analogue signal is converted into a digital signal. This digital signal is transmitted to a computer system 31 in which the main area of concentration of the registration mark or of the part of the pattern is evaluated in order to form a significant main area of concentration corresponding to the position of the registration mark or of the part of the pattern and in order to establish the co-ordinates for that point.

The computer system 31 will evaluate any signals which are received and the estimated positional values relating to the position of the material 8 and will form corresponding control signals which, via stepping motor controllers 32 and stepping motor drives 33 control each of the stepping motors 25, 26 and 27 in such a way that the second pattern 10a will be located with the smallest possible discrepancy relative to the pattern 8a.

It may be mentioned at this point that the type of camera chosen was the Reticon MC521, and that the type of camera controller chosen was the Reticon RS521.

The computer system 31 utilizes a type 8088 CPU with the appropriate software.

The stepping motor controller 32 selected was a stepping motor controller of type JP28 marketed by the MICRO-CONTROLE company of Paris, France, and the stepping motor drive selected was the type TL17 stepping motor drive marketed by the MICRO-CONTROLE company.

The stepping motors 25, 26 and 27 selected were also of the type VP70-40 marketed by the MICRO-CONTROLE company.

The present invention thus proposes an arrangement enabling a second pattern 10a originating from a first pattern formed on a stencil to be positioned in relation to a material 8 intended for the pattern or in relation to a pattern 8a applied thereto. For this purpose are proposed organs, usually being part of the computer system 31, in the form of a memory, which is so arranged as to store the position of the second pattern 10a relative to a reference point, usually being the frame of the printing machine.

In order to establish the position of the pattern 10a in relation to the frame of the printing machine a proof is taken of the pattern 1a, and the positional values of this second pattern 10a for the registration marks or parts of the pattern are evaluated by introducing sensing organs 28 and 29 and by causing these to establish the position of the registration marks.

The insertion distance or the position in which a reading is taken by the sensing organs is stored in a memory 31a.

The adjustment position for the adjustment organs 25, 26 and 27 is stored in a memory 31b.

The positional values for the main area of concentration of the registration marks are stored in a memory 31c.

When a material 8 to which the second pattern 10a is to be transferred then assumes the printing position, the position of the material must still be evaluated even in this position. This evaluation takes place with the help of the organs 28, 29.

In order to establish the position of the material 8 or its pattern 8a in relation to the frame of the printing machine, the sensing organs 28 and 29 are introduced in order to establish the position of the registration marks or a part of the pattern 8a.

The insertion distance or the position in which a reading is taken by the sensing organs is stored in a memory 31f.

The positional values for the main area of concentration of the registration marks are stored in a memory 31h.

Also included in the computer system 31 are means 31k so arranged as to be capable of evaluating any discrepancy which may arise if the second pattern 10a were to be applied to the material in that printing position. As soon as the actual discrepancy has been evaluated a frame holding the stencil and/or a printing table and/or a sheet of material shall be displaced or caused to move in some other way into a position dependent on the size and direction of the discrepancy such that, when the second pattern 10a is applied to the material 8, said pattern will assume a position on the material in which the previously established discrepancy is compensated for in full or to a satisfactory degree.

It is clear that the position of each sheet of material will be sensed and that the necessary compensation for any discrepancy will be made before the application of the first pattern as a second pattern to the material. Once the value and direction of any discrepancy has been established, taking into account the position of the sensing unit during sensing by the computer units 31k, the adjustment organs 25, 26 and 27 will be influenced in such a way that the discrepancy will be compensated for completely or to the greatest possible extent, and that the second pattern 10a will be positioned above the pattern 8a.

The extent of the influence exerted on the adjustment organs 25, 26 and 27 is stored in the memory so that any compensation for a subsequent discrepancy takes place from the immediately preceding position.

In particular in the case where the material has already been printed with a pattern, and when the material advances into the printing position, a sensing organ shall obtain data relating to the positional values for the actual position of the pattern 8a, and these data shall be transmitted to said computer unit 31k, which is capable via its memory of retrieving data in respect of those positional values which would be applicable to the second pattern 10a if that were to be applied to the material without adjustment. The values obtained from the organ 29 are compared in the computer unit 31 with the values already stored there, with the computer unit being so arranged as to evaluate any eventual discrepancy and, in the event of such discrepancy being identified, organs capable of interacting with the stencil frame and/or the printing table and/or the material will be influenced in such a way that the discrepancy will be compensated for in full or to a satisfactory extent. The optical sensing organs 28, 29 interact with a position-sensing unit capable of being introduced between the stencil and the material into a pre-determined position capable of calculation.

The invention also proposes that, in the presence of a number of printing tables, each of which is so adapted as to apply a printed image to a sheet of material with accurate registration on each printing table, only the first of these printing tables shall be equipped with sensing organs intended to evaluate the position of the material and of the pattern which is to be applied to the material, whereas the adjustment organs 25, 26 and 27 of the other printing tables shall be set to provide accurate printing at each of the printing tables.

As an alternative it is, of course, possible for sensing organs at each printing table to evaluate the printing position for the print applied at the preceding printing table, and in this way the organ will obtain data in respect of the values for the actual position of the pattern, said data being transferred to the computer unit in which are stored previously obtained data in respect of those values which are applicable to the second pattern of this printing table at the time of printing and to its desired position. The values obtained are compared in the computer unit and are so arranged that, in the event of an actual discrepancy being identified, a displacement movement or similar will be imparted to the stencil frame and/or to the printing table and/or to the material so as to compensate fully or to a satisfactory extent for the evaluated discrepancy.

In order to increase the productivity of the equipment it is proposed that, during the period when the material provided with print is being removed, position-sensing organs should be introduced between the stencil and the printing table and that, once the material has been registered on the printing table, organs will sense the position of the material, whereupon the position-sensing organs are withdrawn. During this period any discrepancy is evaluated and measures are taken in order to compensate for this, whereupon print can be applied to the material.

The invention is not, of course, restricted to the embodiment described above by way of example, but may undergo modifications within the context of the following Patent Claims.

I claim:

1. Method for positioning a second pattern (10a) originating from a first pattern (1a) formed on a stencil in relation to a material (8) intended for the pattern, with said second pattern (10a) being formed by causing a coating intended for the material to pass through the first pattern, for example by means of a scraper blade in a silk screen printing machine, characterized in that the position of the second pattern (10a) relative to a reference point, usually the frame components of the printing machine, is stored in an organ, and in that when a material to which the second pattern (10a) is to be transferred has been moved into a printing position, the position of the material or of a pattern already applied to it is evaluated as well as any discrepancy which would arise if the second pattern (10a) were to be applied to said material in said position, whereupon a frame holding the stencil and/or a printing table and/or the material is displaced or is caused to move in some way into a position dependent on the size and direction of the discrepancy such that, when the second pattern (10a) is applied to the material, said pattern will adopt a position on the material in which any previously identified discrepancy will be compensated for fully or to a satisfactory extent.

2. Method in accordance with patent claim 1, in which the position of the material is evaluated with the help of registration marks or a part of a previously applied pattern, characterized in that the position is evaluated with the help of optical sensing organs, registration marks, or a part of a previously applied pattern.

3. Method in accordance with patent claim 1, characterized in that the position of each sheet of material is sensed, and in that compensation for the discrepancy is made before the printing of the second pattern takes place.

4. Method in accordance with patent claim 1, characterized in that, when a sheet of material has already been printed with a pattern, the position of said pattern is evaluated, without causing the material to move, in relation to a previously determined anticipated position of the second pattern on the material.

5. Method in accordance with patent claim 1, characterized in that the discrepancy is evaluated at a number of reference positions, and in that the size and direction of each discrepancy, and possibly the location of each of the reference positions, constitute calculation quantities for the evaluation of the size and direction which is applicable to the minimum possible total discrepancy for the application of the second pattern.

6. Method in accordance with patent claim 1, characterized in that (a) the position of the second pattern (10a) is determined in relation to the frame or frame components of the silk screen printing machine;

(b) the position of the material (8) and/or of its pattern (8a) is determined in relation to the position of the second pattern (10a) and to the frame of the silk screen printing machine when the material (8) adopts a position intended for printing;

(c) in the event of a discrepancy being identified between 'a' and 'b' measures are taken in order to displace the position of the second pattern towards a desired position with a small discrepancy; and (d) the second pattern (10a) is transferred to the material (8).

7. Method in accordance with patent claim 2, characterized in that the position of each sheet of material is sensed, and in that compensation for the discrepancy is made before the printing of the second pattern takes place.

8. Method in accordance with patent claim 3, characterized in that, when a sheet of material has already been printed with a pattern, the position of said pattern is evaluated, without causing the material to move, in relation to a previously determined anticipated position of the second pattern on the material.

9. Method for positioning a second pattern originating from a first pattern formed on a stencil in relation to a material intended for the pattern, with said second pattern being formed by causing a coating intended for the material to pass through the first pattern by means of a scraper blade in a screen printing machine, characterized in that, when the second pattern is applied to the material the position of that pattern is evaluated without moving the material in relation to a pre-determined desired position on the material, and in that, in the event of a discrepancy being identified between the position of the second pattern and the desired position, the size and direction of the discrepancy is evaluated, whereupon a frame holding the stencil and/or the printing table and/or the material is displaced or caused to move in some other way into a position dependent on the size and direction of the discrepancy such that, when the next pattern is applied in order to form the second pattern the discrepancy is compensated for fully or to a satisfactory degree.

10. Method according to patent claim 9, characterized in that the discrepancy between the position of the second pattern and the desired position is evaluated at a number of reference positions, and in that the size and direction of the respective discrepancy and, if appropriate, the location of its reference position constitute calculation quantities for the evaluation of the size and the direction applicable to the smallest possible total discrepancy.

11. Method according to patent claim 9, characterized in that (a) the position of the material and/or the printing table in relation to the frame of the silk screen printing machine is determined first;

(b) the second pattern is then applied to the material;

(c) finally, the position of the second pattern in relation to the frame of the silk screen printing machine is determined; and (d) in the event of a discrepancy being identified between 'a' and 'c' measures are taken in order to displace the position according to 'c' towards the position according to 'a'.

12. Arrangement for positioning in a silk screen printing machine a second pattern (10a) originating from a first pattern (1a) formed on a stencil in relation to a material intended for the pattern, characterized in that an organ (31a, 31b, 31c) is so arranged as to store the position of the second pattern relative to a reference point, usually being the frame of the silk screen printing machine, in that a material (8) to which the second pattern (10a) is to be transferred is capable of being displaced into a printing position, in that an organ (28, 29) is so arranged as to evaluate the position of the material in that location, in that means (31k) are also provided which are so arranged as to evaluate any discrepancy which would arise if the second pattern (10a) were to be applied to said material (8) in said location, and in that any discrepancy is evaluated and, in the event of such discrepancy being identified, a frame holding the stencil and/or a printing table and/or the material is displaced or is caused to move in some other fashion into a position dependent on the size and direction of the discrepancy such that, when the second pattern (10a) is applied to the material, said pattern (8) will adopt a position on the material in which any previously identified discrepancy will be compensated for fully or to a satisfactory extent.

13. Arrangement in accordance with patent claim 12, in which the position of the material is capable of being evaluated with the help of registration marks or a part of a previously applied pattern, characterized in that the position of the material and/or of its pattern is evaluated with the help of one or more optical sensing organs, said evaluation preferably being performed in relation to the position of a registration mark.

14. Arrangement in accordance with patent claim 12, characterized in that the position of each sheet of material is sensed and compensation is made for any actual discrepancy before the printing takes place of the first pattern onto the material in the form of a second pattern.

15. Arrangement in accordance with patent claim 12 characterized in that, when a sheet of material which has already been printed with a pattern moves into a position ready for printing, an organ will obtain data in respect of the positional values for the actual position of the pattern, said values being transferred to a computer unit in which are stored data in respect of the values for a second pattern if this were to be applied to the material, in that the values thus obtained from the organ are compared in the computer unit with values stored therein, with the computer unit being so arranged as to evaluate any discrepancy and, in the event of such discrepancy being identified, to apply to organs capable of interacting with the stencil frame and/or the printing table and/or the material an influence such that the discrepancy will be compensated for in full or to a satisfactory extent.

16. Arrangement in accordance with patent claim 12, characterized in that the organ consists of a position-sensing organ capable of being introduced between the stencil and the material into a pre-determined position capable of calculation.

17. Arrangement in accordance with patent claim 12, in which one and the same silk screen printing machine exhibits a number of printing tables and associated stencils and scraper blades, etc., in which one and the same sheet of material is so arranged for the purpose of producing different patterns as to be moved in stages from one printing table to an adjacent printing table, characterized in that a number of printing tables are equipped with organs intended to evaluate the position of that pattern which has been applied to the material at the preceding printing table, in that the data obtained by the organ in respect of the values for the actual position of the pattern are transferred to a computer unit in which are stored data in respect of those values which are applicable to the second pattern of that printing table at the time of printing and its desired position, and in that the values thus obtained are compared in the computer unit, which is so arranged that, in the event of a discrepancy being identified, it will apply to the stencil frame and/or the printing table and/or the material a displacement movement or similar such that the evaluated discrepancy is compensated for fully or to a satisfactory extent.

18. Arrangement in accordance with patent claim 12 characterized in that, whilst a sheet of material to which print has been applied is being removed, position-sensing organs are introduced between the stencil and the printing table, and in that said organs read the position of a sheet of material which has been registered with the printing table, whereupon the position-sensing units are withdrawn and during this period any discrepancy is evaluated and measures are taken to compensate for the latter, whereupon print is applied to the material.

19. Arrangement in accordance with patent claim 12, characterized in that the main area of concentration of a registration mark or part of a pattern which has been scanned is capable of being evaluated in order to produce a significant value for the position.

20. Arrangement in accordance with patent claim 12, characterized in that the scanning of a registration mark or part of a pattern takes place in the form of optical scanning, and in that the evaluated analogue values are capable of being converted into digital values and of being entered into a computer unit.

21. Arrangement in accordance with patent claim 20, characterized in that the sensing unit appropriate to the optical scanning function is capable of fore-and-aft adjustment.

22. Arrangement in accordance with patent claim 20, characterized in that the position of the displacement location (the 'x' and 'y' co-ordinates) is entered into the computer unit.

23. Arrangement in accordance with patent claim 21, characterized in that the computer unit is so arranged as to control via a signal converter and adapter circuits a number of stepping motors for the purpose of causing the stencil frame, the printing table and/or the material to be displaced towards a position in which any discrepancies will be minimized.

24. Arrangement in accordance with patent claim 13, characterized in that the position of each sheet of material is sensed and compensation is made for any actual discrepancy before the printing takes place of the first pattern onto the material in the form of a second pattern.

25. Arrangement in accordance with patent claim 13, characterized in that, when a sheet of material which has already been printed with a pattern moves into a position ready for printing, an organ will obtain data in respect to the positional values for the actual position of the pattern, said values being transferred to a computer unit in which are stored data in respect of the values for a second pattern if this were to be applied to the material, in that the values thus obtained from the organ are compared in the computer unit with values stored therein, with the computer unit being so arranged as to evaluate any discrepancy and, in the event of such discrepancy being identified, to apply to organs capable of interacting with the stencil frame and/or the printing table and/or the material an influence such that the discrepancy will be compensated for in full or to a satisfactory extent.

* * * * *